United States Patent
Stewart (10) Patent No.: US 7,018,114 B2
(45) Date of Patent: Mar. 28, 2006

(54) POWER OPTIMIZATION FOR OPERATION OF OPTOELECTRONIC DEVICE WITH THERMOELECTRIC COOLER

(75) Inventor: James Stewart, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/835,195

(22) Filed: Apr. 29, 2004

(65) Prior Publication Data

US 2005/0185898 A1    Aug. 25, 2005

Related U.S. Application Data

(60) Provisional application No. 60/546,782, filed on Feb. 21, 2004.

(51) Int. Cl.
*G02B 6/36* (2006.01)
(52) U.S. Cl. ............... 385/92; 385/88; 372/34; 372/36
(58) Field of Classification Search .......... 385/88, 385/92; 372/34, 36
See application file for complete search history.

(56) References Cited

U.S. PATENT DOCUMENTS

| | | | | |
|---|---|---|---|---|
| 5,717,712 A | * | 2/1998 | Swaminathan et al. | 372/107 |
| 6,449,295 B1 | * | 9/2002 | Ostromek | 372/25 |
| 6,584,128 B1 | * | 6/2003 | Kroeger | 372/34 |
| 6,792,015 B1 | * | 9/2004 | Theodoras et al. | 372/34 |
| 6,826,212 B1 | * | 11/2004 | Shirai et al. | 372/36 |
| 6,852,928 B1 | * | 2/2005 | Giaretta et al. | 174/52.5 |
| 2003/0033819 A1 | * | 2/2003 | Prescott | 62/3.7 |

* cited by examiner

*Primary Examiner*—Michelle Connelly-Cushwa
*Assistant Examiner*—Rhonda S. Peace
(74) *Attorney, Agent, or Firm*—Workman Nydegger (57) ABSTRACT

A system and method of minimizing the amount of power that is used by an optoelectronic module is disclosed. The system uses a thermoelectric cooler (TEC) to maintain a case temperature of the module at about 50° C. This allows the TEC to operate in the much more efficient heating mode, thus minimizing the amount of current being used to maintain the module temperature. The method includes the steps of determining a temperature range and operating temperature for an optoelectronic module, such that a maximum current level is not exceeded. In one exemplary embodiment, an operating temperature of about 50° C. with a temperature range of from about −5° C. to about 75° C. allows a maximum current of about 300 mA.

24 Claims, 6 Drawing Sheets

POWER OPTIMIZATION FOR OPERATION OF OPTOELECTRONIC DEVICE WITH THERMOELECTRIC COOLER

CROSS-REFERENCE TO RELATED APPLICATIONS

The United States patent application claims priority to and the benefit of U.S. Provisional Patent Application Ser. No. 60/546,782, filed Feb. 21, 2004, entitled "Power Optimization for Operation of Laser with Thermoelectric Cooler", the disclosure of which is incorporated herein by this reference.

BACKGROUND OF THE INVENTION

1. The Field of the Invention

The present invention relates to the field of optoelectronic modules, and more particularly, to minimizing the amount of power consumed by an optoelectronic module using Thermo-Electric Coolers (TECs) for temperature control.

2. The Relevant Technology

Fiber optic technologies are increasingly used for transmitting voice and data signals. As a transmission medium, fiber optics provides a number of advantages over traditional electrical communication techniques. For example, light signals allow for extremely high transmission rates and very high bandwidth capabilities. Also, light signals are resistant to electromagnetic interferences that would otherwise interfere with and possibly degrade electrical signals. Light signals also can be transmitted over greater distances without the signal loss typically associated with electrical signals on copper wire.

While optical communications provide a number of advantages, the use of light as a transmission medium presents a number of implementation challenges. In particular, data carried by a light signal must be converted to an electrical format when received by a device, such as a network switch. Conversely, when data is transmitted to the optical network, it must be converted from an electronic signal to a light signal. The transmission of optical signals is typically accomplished by using a photonic device, such as a transceiver module, at both ends of a fiber optic cable. Each transceiver module typically contains a laser transmitter circuit capable of converting electrical signals to optical signals, and an optical receiver capable of converting received optical signals back into electrical signals.

These transceiver modules electrically interface with a host device, such as a host computer, switching hub, network router, switch box, computer input/output (I/O), or the like, via a compatible connection port. In some applications, it is desirable to miniaturize the physical size of the transceiver module to increase the number of transceiver modules that interface with the host device. By increasing the number of connection ports, the host devices accommodate a higher number of network connections within a given physical space. In some circumstances, it may be desirable for the transceiver module to be hot-pluggable, i.e., permitting inserting and removing of the transceiver module from a host device without interrupting electrical power.

To accomplish many of these objectives, and to ensure compatibility between different manufacturers, adopted international and industry standards define the physical size and shape of optical transceiver modules. For example, a group of optical component manufacturers developed a set of standards for optical transceiver modules termed Small Form-factor Pluggable (SFP) transceivers. In addition to the details of the electrical interface, this standard defines the physical size and shape for the SFP transceiver modules, and the corresponding connection port or module cage associated with the host device. These standards ensure interoperability between different manufacturers' products. More recently, the 10 Gb/s Small Form Factor Pluggable (XFP) standard was adopted, with all of the corresponding details concerning size, current draw, etc.

With smaller transceiver packages that meet the SFP or XFP standard, and increasing data rates, heat generated by the transceivers has become a problem. Heat dissipation mechanisms or cooling mechanisms alleviate the excessive heat created by the lasers and laser diodes within these transceivers. For instance, 10-Gigabit transceivers generally require heat dissipation mechanisms to operate in a standard temperature range of 15–30 degrees Celsius (° C.), whereas transceivers used with lower speed optical transmissions may not require heat dissipation. The use of heat dissipation mechanisms, however, increases the complexity and cost of assembling the transceiver, reduces the space that would otherwise be available for the functional optical and electrical components of the transceiver, and increases the amount of power required to operate the transceiver.

One type of heat dissipation or cooling mechanism is a thermoelectric cooler (TEC). A TEC maintains the temperature of a transceiver or a specific component of the transceiver at a predefined point. If the component gets too hot, current flows in one direction in the TEC to produce cooling. If the component gets too cold, the current flows in the other direction and the TEC acts as a heater. Unfortunately, TECs require much more power during cooling mode than heating mode. As the temperature of the module increases, the power consumed by the TEC for cooling increases exponentially.

Figure 1:
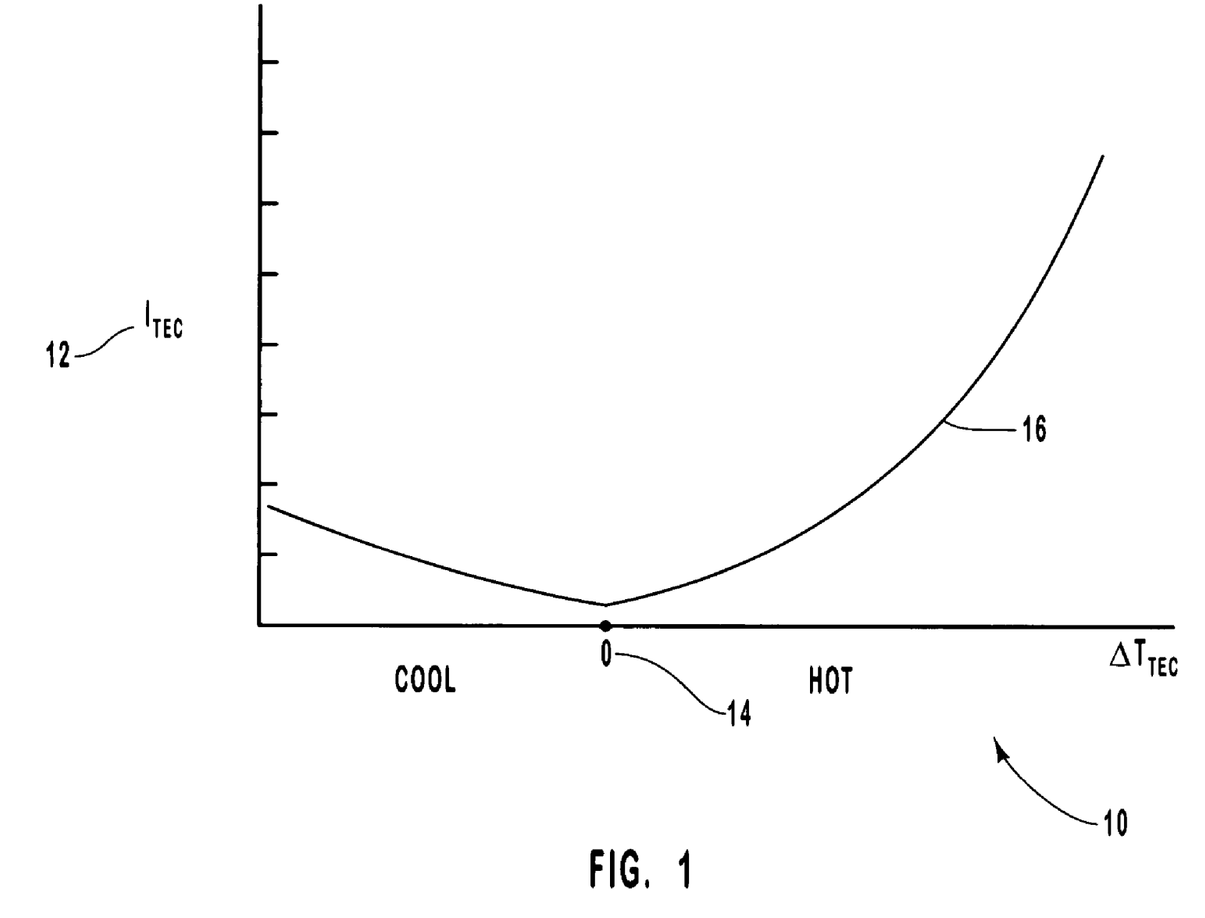
FIG. 1 illustrates a graph of TEC current vs. the difference in temperature between the hot and cold sides of the TEC ($\Delta T_{TEC}$)

FIG. 1 shows a graph 10 that is a schematic representation of the relationship between the current drawn by a TEC, shown as reference numeral 12, versus the difference in temperature between the hot and cold sides of the TEC ($\Delta$T of the TEC). The zero power temperature for the TEC identified as "0", i.e., the point where there is no difference in temperature between the cold and hot side of the TEC, shown as reference numeral 14. As can be seen from a plot 16 on graph 10, as the $\Delta$T of the TEC becomes negative, the amount of current drawn by the TEC for heating goes up only slightly. This is because the TEC begins operating in heating mode, and draws a small amount of current. However, as the $\Delta$T becomes positive, the amount of current drawn by the TEC for cooling goes up very rapidly. This is true because TECs are much more efficient heaters than coolers.

In a transceiver application, it is common for the base of the TEC (hot-side) to be thermally attached to the case of the transceiver, and for the laser to be attached to the top of the TEC (cold-side). For this common arrangement, the TEC is in a heating mode when the transceiver case temperature is lower than the desired laser set temperature, and conversely, the TEC is in cooling mode when the transceiver case temperature is higher than the laser set temperature. To operate the TEC as efficiently as possible, it is desirable to operate the TEC in a heating mode over a wide range of transceiver case temperatures.

With current transceiver modules designed to operate the laser in a temperature range from about 15° C. to about 30° C., a problem arises. Due to the working environment of typical transceiver modules, i.e., many modules mounted closely together, the operating case temperatures of the transceivers far exceed the desired laser temperature range, requiring that the TEC controlling the laser temperature run in the less efficient cooling mode. This presents a problem, because the overall amount of power available to the transceiver module, including the TEC, is limited, and expending a large amount of power to keep the transceiver's laser cooled to no more than 30° C. is undesirable.

A related problem is the bandwidth available to the transceiver module in the given temperature range. It is known in the art that the channel spacing can be tuned by adjusting the temperature. For instance, with a channel spacing of about 100 GHz, a temperature shift of about 10° C. is required to move between channels. For transceivers designed to operate at several DWDM channels, it is necessary to increase the temperature control range of the TEC to provide the necessary thermal tuning. To operate at a single 100 GHz channel, a temperature control range of approximately 10° C. is typically required. However, to operate over two 100 GHz channels, a temperature control range of approximately 20° C. is required. For multi-channel applications, it becomes even more critical to optimize the laser temperature range to minimize TEC power consumption.

BRIEF SUMMARY OF THE EXEMPLARY EMBODIMENTS

In light of the above, it would be desirable to operate the thermoelectric cooler (TEC) in the more efficient cooling mode, over a wide range of module temperatures, to minimize the module (TEC) power consumption. It would also be beneficial if the module could operate over an extended range of temperatures to allow for tuning of the module at a plurality of channels. This allows for the transmission of larger amounts of data and still maintains low overall power consumption.

The present invention describes an optoelectronic device that operates in a temperature range that allows the TEC to operate for a majority of the time in the heating mode. As a result, the current draw for the optoelectronic device is maintained below a defined maximum over an expanded temperature range. In one exemplary embodiment, while maintaining the module current at or below 300 mA, the module can be operated in a temperature range from about −10° C. to about 75° C. This is accomplished in one configuration by setting the laser operating temperature to approximately 50° C. By operating the laser at an elevated temperature, the TEC used to maintain the laser temperature can stay in the relatively efficient heating mode for a majority of the time.

In another configuration, the laser's operating temperature can be elevated so that the TEC operates only in the heating mode. In either case, the result is an efficient optoelectronic module that draws less current than existing modules, while maintaining the efficiency of the laser.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Exemplary embodiments of the present invention are directed towards alleviating the problem of excessive TEC current being drawn at higher temperatures to cool components of the optoelectronic device or module. These embodiments allow for an increased case temperature for the device or module, to allow the TEC to remain in the more efficient heating mode rather than entering the less efficient cooling mode.

This is advantageous over existing temperature control systems that seek to optimize the performance of components of the optoelectronic device, such as a laser within a transceiver module, over a temperature range. Such existing systems attempted to design a temperature control system to control the laser to the optimized temperature. Unfortunately, this resulted in transceiver systems where the temperature control system power was much too high for use in small, pluggable transceiver applications, such as, but not limited to, 10 Gigabit Small Form Factor Pluggable (XFP) Modules.

Exemplary embodiments of the present invention do just the opposite through determining a laser temperature range that minimizes the amount of power used by the temperature control system, and therefore, the module as a whole. This results in a much more efficient use of power over a much larger temperature range than existing optoelectronic modules.

Further, exemplary embodiments of the present invention provide several advantages over existing optoelectronic modules that typically operate in a temperature range from about 15° C. to about 30° C. For instance, as more and more existing modules are packed into a patch panel, the temperature inside the panel tends to rise. This requires the TEC of existing modules to operate to lower the module temperature. Since TECs are much less efficient in cooling mode, maintaining a maximum laser temperature of 30° C. often requires more current than the module as a whole is allowed to draw under applicable standards. No matter the existing standard, existing optoelectronic modules tend to draw excessive current as the TEC cools the laser to below the 30° C. threshold level. The current invention overcomes this by operating the laser at elevated temperatures so that the TEC operates at least a majority of the time in heating mode rather than the less efficient cooling mode. This results in the optoelectronic module drawing current below a defined threshold over a greater temperature range than existing optoelectronic modules.

An additional advantage is provided in that the optoelectronic module operates over an expanded temperature range, for a desired power consumption or current load. This allows for a single module to transmit data on multiple channels, by tuning the laser temperature for the selected channel. Modules that can be operated on several channels allow manufacturers to reduce the number of parts needed to cover a range of channels, and reduce inventories for those who deploy these systems.

Figure 2:
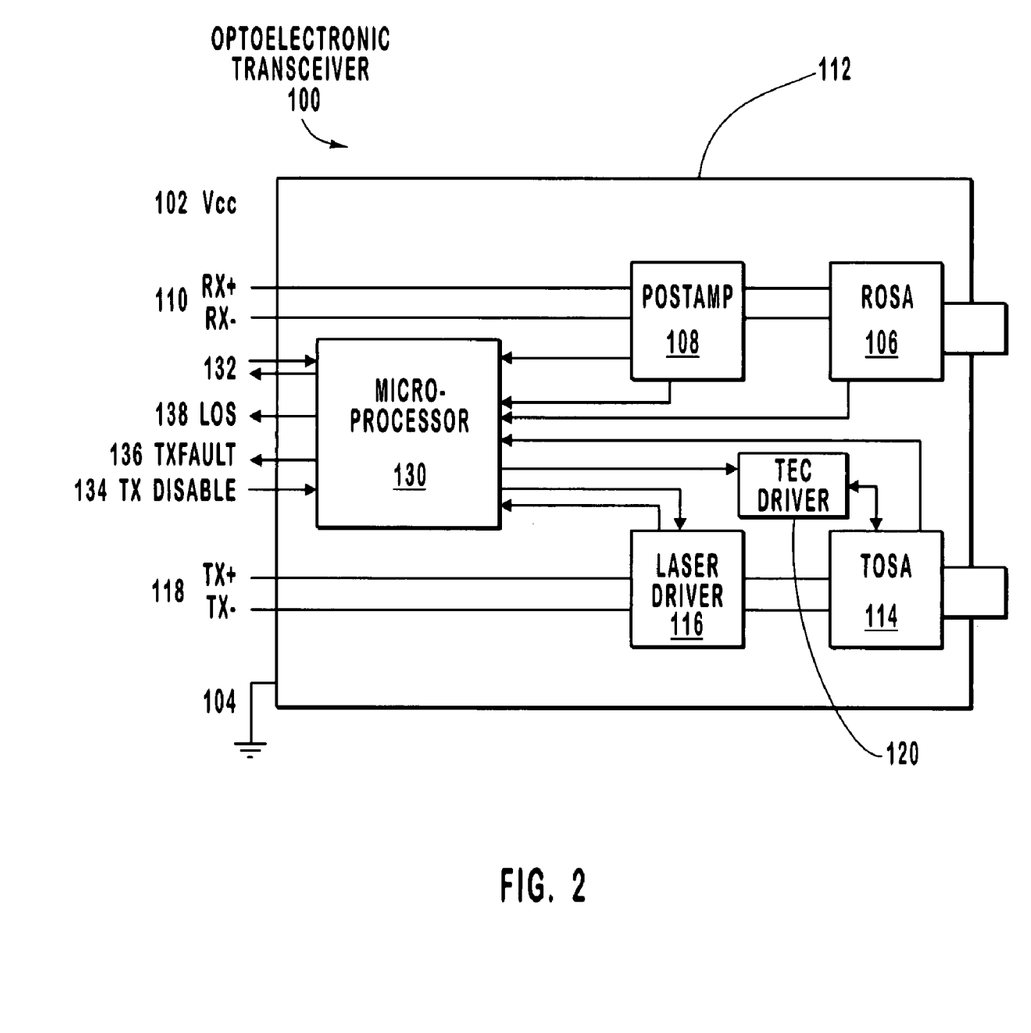
FIG. 2 is a block diagram of one embodiment of an optoelectronic transceiver.

FIG. 2 shows a schematic representation of an optoelectronic transceiver 100. Transceiver 100 contains, at a minimum, transmit and receiver circuit paths, one or more power connections 102 and one or more ground connections 104. Further, transceiver 100 includes a Receiver Optical Subassembly (ROSA) 106, which contains a mechanical fiber receptacle and coupling optics, as well as a photo diode and a pre-amplifier (preamp) circuit. ROSA 106 is in turn connected to a post-amplifier (postamp) integrated circuit 108, the function of which is to take relatively small signals from ROSA 106 and amplify and limit them to create a uniform amplitude digital electronic output, which is connected to outside circuitry via RX+ and RX− pins 110. The postamp circuit 108 provides a digital output signal known as Signal Detect or Loss of Signal indicating the presence or absence of suitably strong optical input. All the components of transceiver 100 may be located in a protective case or housing 112, except for connectors that may protrude from the housing.

Suitable housings, including metallic, plastic, potting box, and other cases or housing structures are well known in the art. In one embodiment, protective case 112 is as follows: width, 3 cm or less; length, 6.5 cm or less, and height, 1.2 cm or less. A Gigabit Interface Converter (GBIC) standard (SFF-8053 GBIC standard version 5.5) requires the dimensions of a module housing to be approximately 3 cm×6.5 cm×1.2 cm. Thus, protective case 112 of this embodiment meets the form factor requirements of the GBIC standard.

In another embodiment, the physical dimensions of case 112 are: width, 0.54 inches or less; length, 2.24 inches or less; and height, 0.34 inches or less. The Small Form Factor Pluggable Multisource Agreement (SFP MSA) requires the dimensions of a compliant module housing to be approximately 0.54"×2.24"×0.34". Thus, the module housing in that embodiment meets the form factor requirements of the SFP standard. Note that the present invention is not limited to the form factor requirements described above. The case 112 may also comply with XFP standards. Further, a person of ordinary skill in the art having the benefit of this disclosure will appreciate that the present invention is adaptable to various existing or yet to be determined form factors, some of which can be smaller or larger than the ones identified here.

The transmit circuitry of transceiver 100 can include a Transmitter Optical Subassembly (TOSA) 114 and a laser driver integrated circuit 116, with signal inputs obtained from the TX+ and TX− pins 118. TOSA 114 contains a mechanical fiber receptacle and coupling optics, as well as a thermo-electric cooler (TEC) and a laser diode or LED. The laser driver circuit 116 provides AC drive and DC bias current to the laser. The signal inputs for the driver are obtained from I/O pins (not shown) of transceiver 100. In other embodiments, the TEC is external to the TOSA 114. In yet other embodiments, the TEC is integrated within a laser transistor-outline (TO) package or other laser packages.

In addition, optoelectronic transceiver 100 includes a thermoelectric cooler (TEC) driver 120 and additional circuitry that is not shown for controlling the temperature of TOSA 114. An embodiment of TEC driver 120 and the additional circuitry is described in greater detail below in connection with FIG. 3.

Also shown in FIG. 2 is a microprocessor 130 which may include one, two, or more chips, configured for controlling the operations of the transceiver 100. Suitable microprocessors include, but are not limited to, the PIC16F873A, PIC16F8730 and PIC16F871 8-bit CMOS FLASH microcontrollers manufactured by Microchip Technology, Inc. Microprocessor 130 is coupled to provide control signals to post-amplifier 108 and laser driver 116, and these components and ROSA 106 and TOSA 114 provide feedback signals back to the microprocessor 130. For example, microprocessor 130 provides signals (e.g., bias and amplitude control signals) to control the DC bias current level and AC modulation level of laser driver circuit 116 (which thereby controls the extinction ratio (ER) of the optical output signal), while post-amplifier circuit 108 provides a Signal Detect output to microprocessor 130 to indicate the presence or absence of a suitably strong optical input.

The bias current level affects the optical output wavelength of transceiver 100. Persons skilled in the art recognize that increases in the bias current changes the temperature of the active region of a laser chip. More specifically, as the bias current increases, so does the power dissipation of the laser chip. And as the power dissipated in the laser chip increases, so does the temperature of the laser chip, which has a fixed thermal resistance. This is true even though the temperature at the base of the laser chip is typically controlled by TEC 120.

Temperature and/or other physical conditions of various components of transceiver 100 may be acquired using sensors that are coupled to microprocessor 130. In some embodiments, conditions of the optical links may also be acquired using the sensors.

In addition to, and sometimes in conjunction with these control functions, there are a number of other tasks that may be handled by microprocessor 130. These tasks include, but are not necessarily limited to, the following:

Setup functions. These generally relate to the required adjustments made on a part-to-part basis in the factory to allow for variations in component characteristics such as laser diode threshold current.

Identification. This refers to the storage of an identity code within a general purpose memory (e.g., an EEPROM). Additional information, such as sub-component revisions and factory test data, may also be stored within the general purpose memory for purposes of identification.

Eye safety and general fault detection. These functions are used to identify abnormal and potentially unsafe operating parameters and to report these to the host device and/or perform laser shutdown, as appropriate. Sensors may be used to identify such abnormal or potentially unsafe operating parameters.

Receiver input optical power measurement. This function is used to measure the input optical power and a report of this measurement may be stored in the memory.

Laser diode drive current. This function is used to set the output optical power level of the laser diode.

Laser diode temperature monitoring and control. In one embodiment, a temperature controller (e.g., a thermal-electric cooler (TEC)) is disposed in or near TOSA 114 for controlling the temperature of the laser emitter therein. In this embodiment, microprocessor 130 is responsible for providing control signals to the temperature controller to maintain the temperature of TOSA 114 within the range of case temperatures defined by the graph illustrated in FIG. 4.

With continued reference to FIG. 2, transceiver 100 may have a serial interface 132 for communicating with a host device. As used herein, a host device refers to a link card to which a transceiver is attached and/or a host system computer to which a transceiver provides an optical connection. Host systems may be computer systems, network attached storage (NAS) devices, storage area network (SAN) devices, optoelectronic routers, as well as other types of host systems and devices.

In some embodiments, optoelectronic transceiver 100 includes an integrated circuit controller that may perform some of the functions listed above. For example, an integrated circuit controller performs the tasks of identification and eye safety and general fault detection, while the microprocessor provides control signals to the temperature controller and also may perform other tasks.

Further, the optoelectronic transceiver may also include a TX disable 134 and TX fault 136 pins described in the GBIC standard (SFF-8053). In the GBIC standard, TX disable pin 134 allows the transmitter to be shut off by the host device, while TX fault pin 136 is an indicator to the host device of some fault condition existing in the laser or associated laser driver circuit. There can also be a Loss of Signal (LOS) pin 138 associated with microprocessor 130. LOS pin 138 allows microprocessor 130 to, for example, shut down the laser in TOSA 114 when a carrier signal has been lost.

Figure 3:
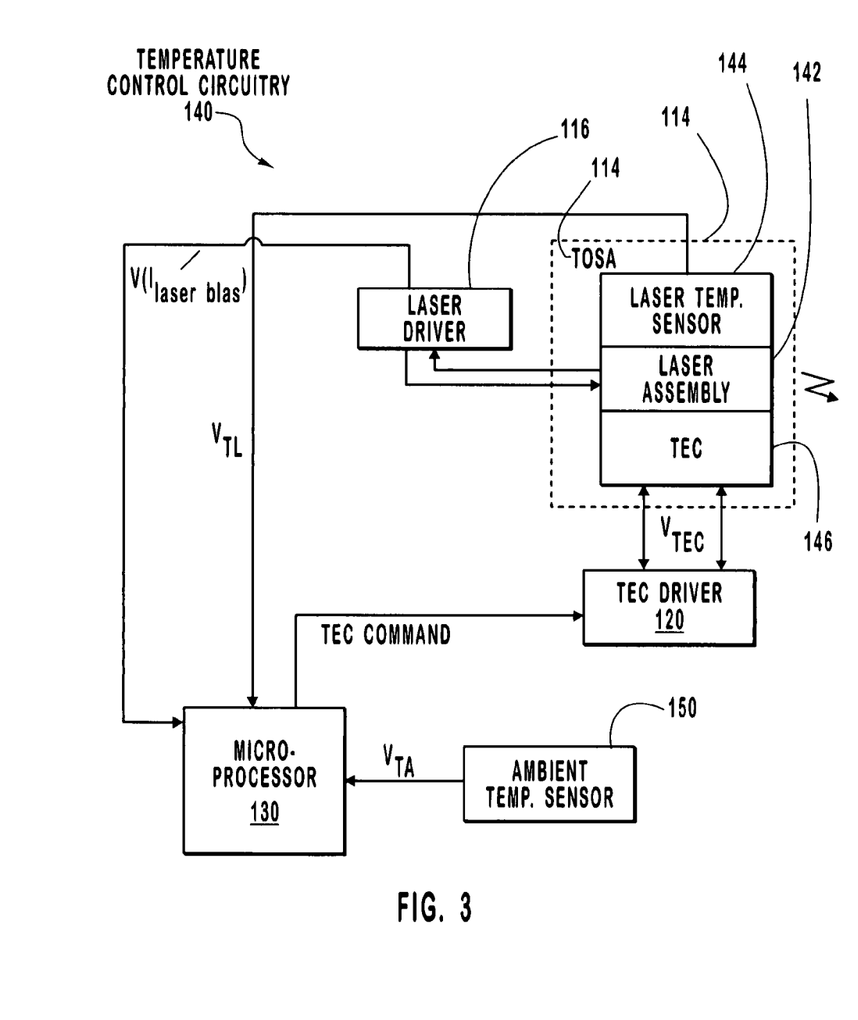
FIG. 3 is a block diagram illustrating circuitry for controlling the temperature of a laser emitter of the optoelectronic transceiver of FIG. 2.

FIG. 3 illustrates a portion of temperature control circuitry 140 of transceiver 100. The temperature control circuitry 140 is coupled to a TOSA 114. In some embodiments, TOSA 114 includes a laser assembly 142 (e.g., a laser transistor outline package), which in turn includes a laser emitter (e.g., an edge emitting laser diode or a vertical cavity surface emitting diode) that is activated when a laser bias current, $I_{laser\ bias}$, is applied. Also shown in FIG. 3 are a laser temperature sensor 144 and a thermoelectric cooler (TEC) 146 coupled to laser assembly 142. In some other embodiments, laser temperature sensor 144 and/or TEC 146 are integrated within laser assembly 142. In yet other embodiments, laser temperature sensor 144 and/or TEC 146 are external to TOSA 114.

In some embodiments, laser temperature sensor 144 is a thermistor. Any other device suitable for measuring the temperature of the laser diode may also be used. Examples of such devices can include, by way of example and not limitation, silicon-IC temperature sensors, thermocouples, resistive temperature detectors (RTDs), and other such devices known to those of skill in the art. The laser temperature sensor 144 generates a signal ($V_{TL}$) that varies as a function of the temperature of the laser diode. As described above, and as is well known to those skilled in the art, the wavelength of optical signals generated by a laser diode varies as a function of the temperature of the laser diode. Accordingly, in other embodiments, a sensor that measures the wavelength of the optical signals directly may be substituted for laser temperature sensor 144. In still other embodiments, a device measuring an operating condition of the laser diode that varies as a function of the temperature of the laser diode is used instead of laser temperature sensor 144.

With reference still to FIG. 3, laser driver circuitry 116 supplies both AC drive power and a DC bias current $I_{laser\ bias}$ to laser assembly 142 to activate the laser emitter and to set the AC modulation of the laser assembly. The microprocessor 130 controls this aspect of laser driver circuitry 116 via the bias control signal and the amplitude control signal. The laser driver circuitry 116 also transmits a voltage $V(I_{laser\ bias})$, which is proportional to the $I_{laser\ bias}$, so that microprocessor 130 may indirectly monitor the actual value of $I_{laser\ bias}$, which may vary due to operating conditions such as temperature. In some embodiments, microprocessor 130 monitors a signal from a back facet photodiode (also called a monitor photodiode) instead of (or in addition to) the voltage $V(I_{laser\ bias})$. In some embodiments microprocessor 130 uses the monitored signal(s) to determine an adjustment to the DC bias current $I_{laser\ bias}$.

An additional input may be optionally provided to microprocessor 130 by an ambient temperature sensor 150, which measures the ambient temperature surrounding TOSA 114 and generates a signal ($V_{TA}$) for microprocessor 130 that varies as a function of the ambient temperature. Although a laser temperature sensor 144 is preferably placed in the proximity of a laser emitter, the temperature reading from laser temperature sensor 144 generally differs from the actual temperature of the laser emitter because laser temperature sensor 144 is physically separated from the laser emitter. As a consequence, the temperature reading from laser temperature sensor 144 and its signal $V_{TL}$ vary as a function of the outside temperature. By receiving the ambient temperature signal $V_{TA}$, microprocessor 130 is able to compensate for the effect of the ambient temperature on the temperature reading from the laser temperature sensor.

In addition to the $V(I_{laser\ bias})$, $V_{TL}$ and $V_{TA}$ signals, microprocessor 130 receives inputs from a host device through serial interface circuitry 132 (FIG. 2). In some embodiments, using the information collected from the host device, laser driver circuitry 116 and ambient temperature sensor 150, microprocessor 130 generates an analog TEC Command signal to set the temperature of the laser emitter in laser assembly 142. In particular, microprocessor 130 generates the TEC Command signal based on inputs of $V(I_{laser\ bias})$ from laser driver circuitry 116, $V_{TL}$ from the laser temperature sensor, $V_{TA}$ from ambient temperature sensor 150, and calibrated values previously stored within microprocessor 130 during the calibration of optoelectronic transceiver 100.

The TEC Command signal is provided to TEC driver circuitry 120. The TEC driver circuitry 120 is configured to generate an output signal $V_{TEC}$ to drive TEC 146 in accordance with the TEC Command signal. As mentioned above, the command signals sent to TEC 146 are based upon setting the operating temperature of laser assembly 142 and/or case 112 (FIG. 2) within certain boundaries so that the current drawn by transceiver 100 is maintained below the maximum level. Additionally, the command signals are selected so that TEC 146 operates always, substantially always, or a majority of the time, in the heating mode.

Figure 4:
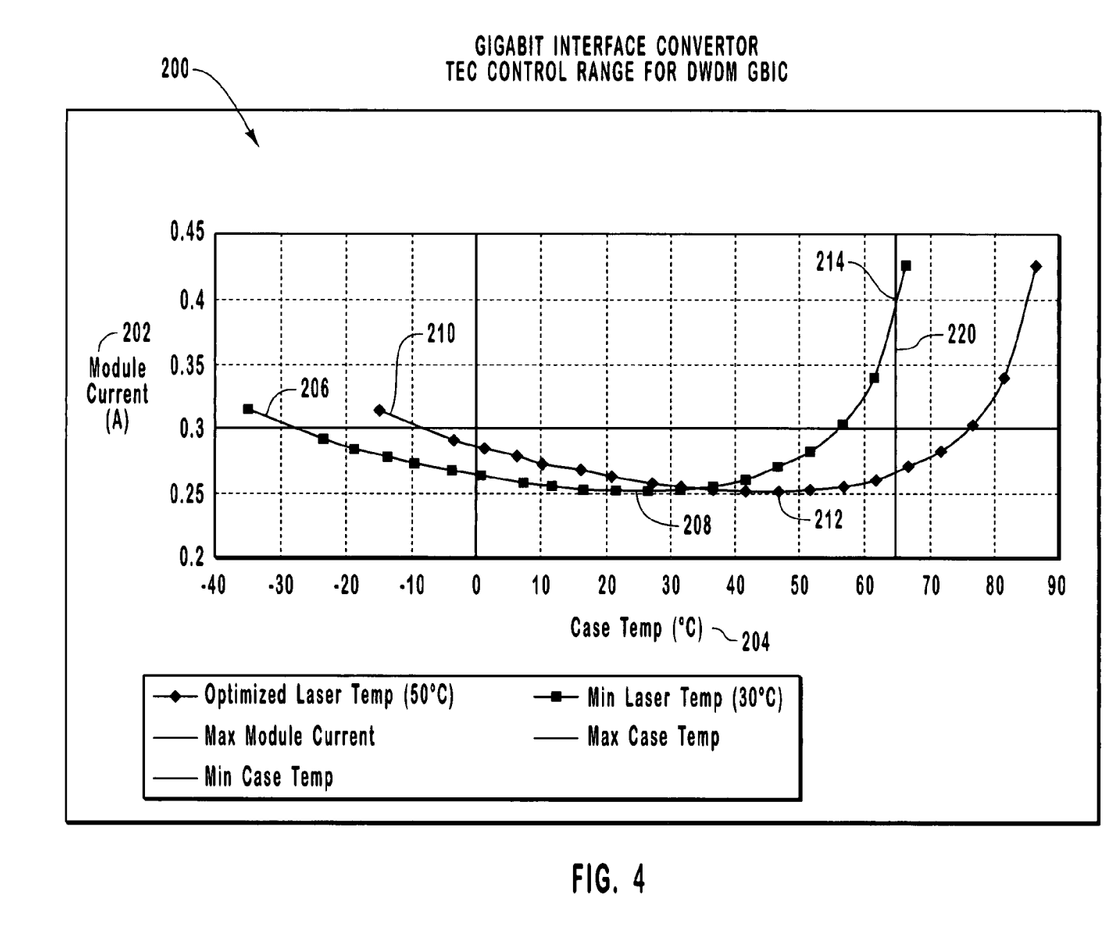
FIG. 4 illustrates a graph showing the current draw of a module vs. the case temperature of the module for a standard and optimized laser temperature.

FIG. 4 illustrates a graphical representation of the current drawn by transceiver 100 based upon the case temperature of the transceiver, for different laser set temperatures. Graph 200 shows a total module current 202 versus a module case temperature 204. The module can be a Dense Wavelength Division Multiplexing (DWDM) Gigabit Interface Converter (GBIC), which is an optoelectronic transceiver that uses a distributed feedback (DFB) laser as part of the transmitter. In one exemplary embodiment of the present invention, the module can be a 10 Gb/s standard form factor pluggable (XFP) module. However, those skilled in the art will realize that other types of modules can also be used. Any module that is designed to operate at a given temperature, or over a given temperature range, and that uses TECs or other temperature maintaining devices to help maintain that temperature, can be used with exemplary embodiments of the present invention.

In FIG. 4, a first plot line 206 shows the total module current when the case temperature is set at a first point 208 of about 30° C. as is typical for existing modules. This temperature point was historically chosen for DWDM applications for a number of reasons. First, DWDM transmitters were originally designed to operate indoors at room temperatures, from about 15° C. to about 30° C. Secondly, the DFB laser used in the modules was also designed to be most efficient and reliable at about 25° C.

Unfortunately, as the density of optical ports in a given panel increases in an effort to reduce the size of systems, the temperature inside the panels increases. Since TECs are very efficient heaters, but much less efficient coolers, as the temperature in the panels goes up, the total power consumption of the modules rises exponentially. This can be readily seen in plot 206. At a maximum case temperature of about 65° C., shown as reference numeral 220, the total current surpasses 400 mA, as shown by reference point 214 in FIG. 4.

For various reasons, it is undesirable to draw so much current. First, for the DWDM GBIC shown in FIG. 4, the maximum module current has been standardized to be <300 mA. This maximum module current includes all power necessary to operate the laser and other electronics in the module, as well as the current used by the TEC to keep the laser or other optoelectronic device at a specified temperature. Secondly, as more and more current is required to power numerous modules in a panel, larger power sources are required. These larger power sources also produce more heat, which must then be dissipated in some fashion.

One exemplary embodiment of a transceiver according to the present invention is illustrated by a second plot 210. The laser assembly 142 (FIG. 3) is operated at an optimized temperature in order to minimize the module current over an expanded case temperature range. For second plot 210, the optimized temperature is around 50° C., as shown by data point 212. This module will stay well below a current value of about 300 mA within a temperature range of about –0° C. to about 75° C. Balancing the current draw over this wide temperature range, such that the current drawn at the low end of the module temperature range (about 0° C.) is approximately equal to the current drawn at the high end of the module temperature range (75° C.) is a benefit of the present invention.

Figure 5:
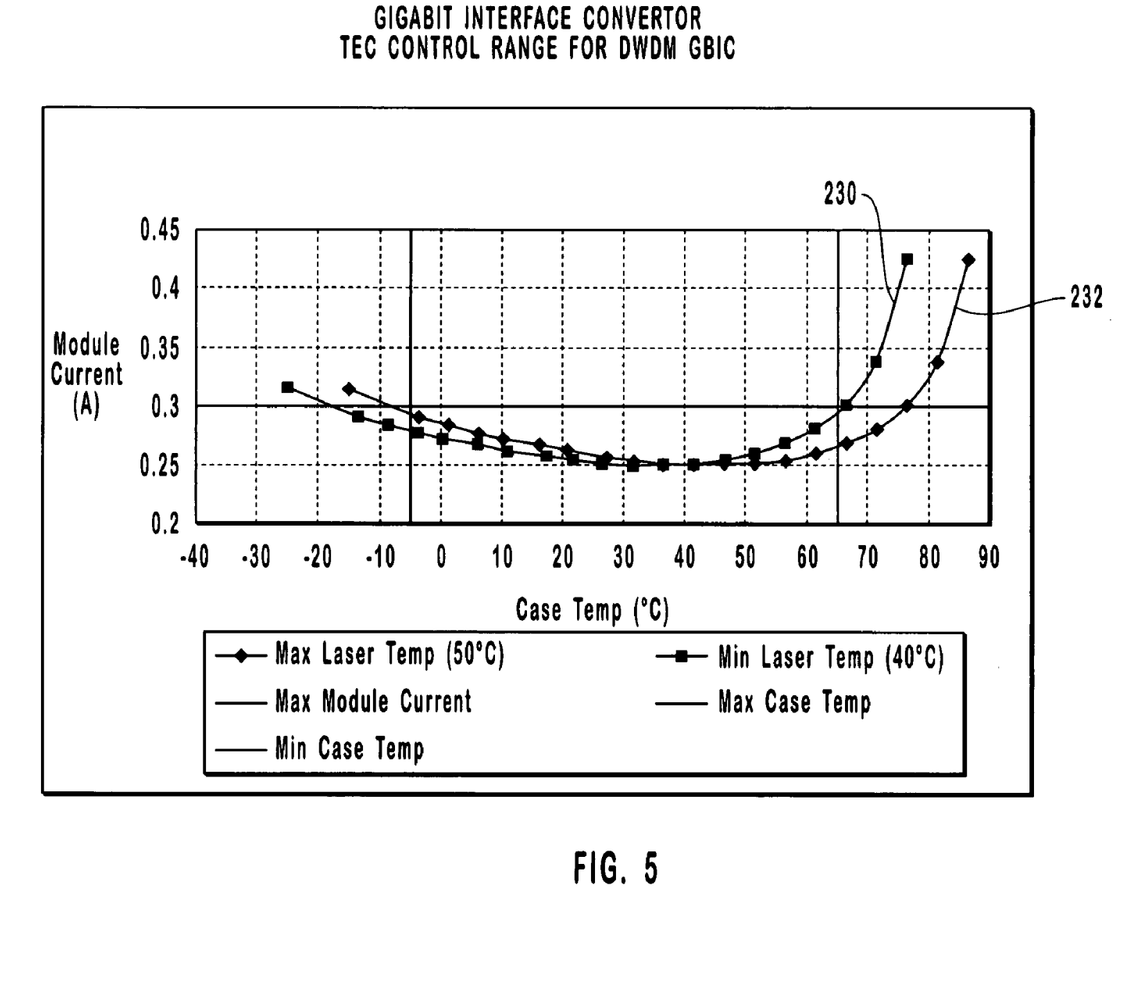
FIG. 5 illustrates a graph showing the current draw of a module vs. the case temperature of the module at two temperatures that allow for wavelength tuning.

In addition, the techniques described above, can be used to balance the current draw of the module for both a range of ambient temperatures, and a range of laser temperatures. Defining a usable range of laser temperatures, allows for thermal tuning of the wavelength of the laser within this range. If the laser temperature range is wide enough, this will allow the laser to operate at multiple channels, as defined by the ITU. For example, as represented in FIG. 5, if the required case temperature range is –5° C. to 65° C., the laser can be operated between 40° C. and 50° C., as represented by lines 230 and 232 respectively, while maintaining the module current below the maximum of 300 mA. For this example, 110° C. is the maximum allowable tuning range. If a greater tuning range is required, for multiple channel operation, then this exercise would be repeated to minimize current consumption over the expanded range, for example a range of 20° C.

Figure 6:
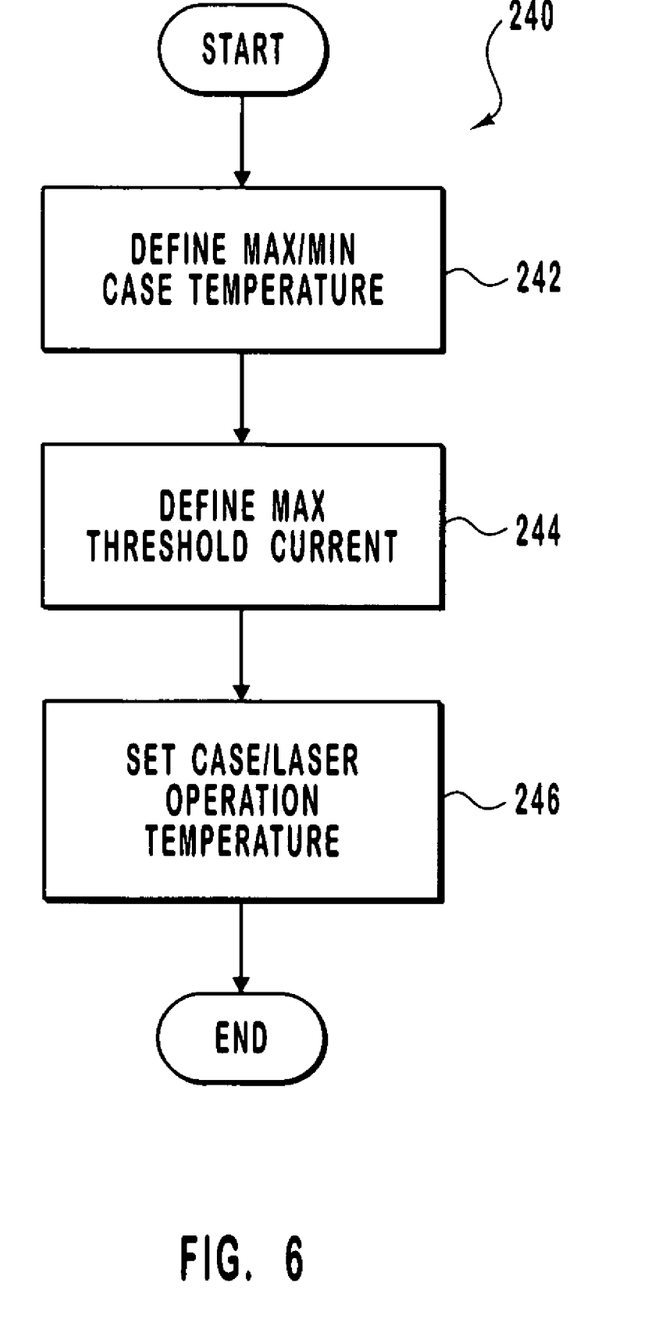
FIG. 6 illustrates one exemplary method for minimizing power consumption in an optoelectronic module.

FIG. 6 illustrates an exemplary method, designated generally as reference numeral 240, for maintaining a desired power consumption level for an optoelectronic module. Method 240 illustrates one exemplary method only. The invention is not limited to the method illustrated, but can include fewer steps, additional steps, or alternate combinations of steps.

Method 240 includes a first step of defining a maximum and minimum case temperature, as represented by block 242. The maximum and minimum case temperatures provide the boundaries over which the optoelectronic device, such as, but not limited to, a laser can be operated. Next, a maximum module current is defined, as represented by block 244. This maximum module current can be set by standards setting organizations, such as, but not limited to the XFP standard, which limits the maximum module current to 400 mA. However, other limits, both higher and lower than 400 mA, are also possible.

The last step in exemplary method 240 is to set the laser operating temperature, as represented by block 246. This laser operating temperature is set such that the power curve, such as the curves shown in FIGS. 4 and 5, remains within the defined boundaries. In one exemplary embodiment of method 240, the maximum and minimum case temperatures are set at 80° C. and 0° C., respectively, the maximum module current is set to 400 mA, and the laser operating temperature is set to 50° C. One skilled in the art will recognize that other ranges, currents and operating temperatures are also possible.

The exemplary embodiments of the present invention provide several advantages over the prior art. Prior art devices have typically been operated in a temperature range from about 15° C. to about 30° C. As more and more modules are packed into systems, the temperature inside the panel tends to rise. This requires the TEC to be engaged at lower ambient temperatures, due to self-heating within the densely packed system. Since TECs are much less efficient in cooling mode, maintaining the lower 30° C. temperature in the panel required more power than the module as a whole is allowed to draw under the applicable standards discussed above.

As described, this technique can be used to minimize power consumption over a defined range of laser operating temperatures. This allows for a single module to transmit data on multiple channels. This greatly increases the efficiency of data transmission for the modules.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic device comprising:
   a casing;
   a laser assembly disposed within said casing;
   a temperature control device communicating with said laser assembly, said temperature control device operating in either a cooling mode or a heating mode; and
   a processor having microcode that, when executed, causes the processor to at least indirectly control the operating temperature of a laser diode included in the laser assembly so as to maintain current draw of the laser assembly within a predetermined range.

2. The optoelectronic device of claim 1, wherein said laser assembly comprises a Dense Wavelength Division Multiplexed Gigabit Interface Converter (DWDM GBIC) transceiver module.

3. The optoelectronic device of claim 2, wherein said DWDM GBIC is an XFP module.

4. The optoelectronic device of claim 1, wherein said casing temperature is maintained in a range from about 45° C. to about 80° C.

5. The optoelectronic device of claim 1, wherein said optoelectronic device draws less than about 400 mA of current when said casing temperature is about 85° C.

6. The optoelectronic device of claim 1, wherein a maximum current flow is less than 300 mA when said casing temperature is in a range from about 0° C. to about 75° C.

7. An optoelectronic device comprising:
    a casing adapted to mount to a communication panel;
    a laser assembly disposed within said casing and capable of drawing current from said communication panel;
    a temperature control device communicating with said laser assembly; said temperature control device controlling a temperature of said casing; and
    means for setting an optimized temperature of a laser diode of the laser assembly based upon a predetermined maximum current draw for the laser assembly, the optimized temperature being selected so as to prevent the current draw for the laser assembly to exceed the predetermined maximum current draw.

8. The optoelectronic device of claim 7, wherein said laser assembly comprises a Dense Wavelength Division Multiplexed Gigabit Interface Converter (DWDM GBIC) transceiver module.

9. The optoelectronic device of claim 8, wherein said DWDM GBIC is an XFP module.

10. The optoelectronic device of claim 7, wherein said casing temperature is maintained in a range from about 45°0 C. to about 80° C.

11. The optoelectronic device of claim 7, wherein, when said casing temperature is about 85° C., said optoelectronic device draws less than about 400 mA of current.

12. The optoelectronic device of claim 7, wherein a maximum current flow does not exceed 300 mA when said casing temperature is in a range from about 0° C. to about 75° C.

13. A method for balancing the current drawn by a laser over a range of operating temperatures for the laser, said method comprising the steps of:
    determining a maximum current draw for a laser over an operating laser temperature range; and
    determining an optimized temperature for the laser based upon the operating laser temperature range, the optimized temperature being selected so that when the operating laser temperature is increased to a maximum temperature of the temperature range the laser draws less than said maximum current, and, when said laser operating temperature is decreased to a minimum temperature for the operating laser temperature range the laser draws less than said maximum current.

14. The method of claim 13, wherein said laser operating temperature is maintained in C range from about −5° C. to about 80° C.

15. The method of claim 13, wherein said module draws less than about 400 mA of cut-rent when said laser operating temperature is about 85° C.

16. The method of claim 13, wherein a maximum current draw is less than 300 mA when said laser operating temperature is in a range from about −5° C. to about 75° C.

17. The method of claim 13, wherein said temperature range is from about −5° C. to about 75° C.

18. The method of claim 17, wherein said optimized temperature is about 50° C.

19. The method of claim 13, wherein said laser is part of a transceiver module.

20. The method of claim 19, wherein said transceiver module is an XFP module.

21. The method of claim 19, wherein said transceiver module is a dense wavelength division multiplexing gigabit interface converter (DWDM GBIC).

22. The method of claim 21, wherein said DWDM GBIC is an XFP module.

23. The optoelectronic device of claim 1, wherein the processor is further configured to limit the amount of time the temperature control device is in the cooling mode.

24. The optoelectronic device of claim 7, wherein the means for setting is a microprocessor in communication with the laser assembly and disposed within the casing.

* * * * *